United States Patent [19]

Licter et al.

[11] Patent Number: 5,012,194

[45] Date of Patent: Apr. 30, 1991

[54] METHOD TESTING ELECTRON DISCHARGE TUBES

[75] Inventors: Philip L. Licter, Nashua, N.H.; John K. Waterman, Newton Corner, Mass.

[73] Assignee: Raytheon Company, Lexington, Mass.

[21] Appl. No.: 402,732

[22] Filed: Sep. 5, 1989

[51] Int. Cl.[5] .......................... H01J 9/42; G01R 31/00
[52] U.S. Cl. ........................................ 324/405; 445/3; 324/410
[58] Field of Search ............... 324/405, 407, 409, 410; 315/3.5, 383; 445/3, 63

[56] References Cited

U.S. PATENT DOCUMENTS

| | | | |
|---|---|---|---|
| 2,965,839 | 12/1960 | Oakes | 324/410 |
| 3,801,892 | 4/1974 | West | 324/410 |
| 3,817,592 | 6/1974 | Swanson | 445/3 |
| 4,038,616 | 7/1977 | Ball | 445/63 |
| 4,167,690 | 9/1979 | Gange | 315/366 |
| 4,471,265 | 9/1984 | Rasmusson | 324/409 |
| 4,534,741 | 8/1985 | Farrall | 324/409 |
| 4,645,988 | 2/1987 | Gawell et al. | 315/383 |
| 4,694,225 | 9/1987 | Tomii et al. | 315/383 |

FOREIGN PATENT DOCUMENTS

| | | | |
|---|---|---|---|
| 74038 | 6/1980 | Japan | 445/3 |
| 186136 | 10/1983 | Japan | 445/3 |
| 72139 | 4/1985 | Japan | 445/3 |
| 656126 | 4/1979 | U.S.S.R. | 445/3 |
| 1129669 | 12/1984 | U.S.S.R. | 445/3 |

*Primary Examiner*—Kenneth Wieder
*Assistant Examiner*—Maura K. Regan
*Attorney, Agent, or Firm*—Donald F. Mofford; Richard M. Sharkansky

[57] ABSTRACT

A method of testing an electron discharge device incorporating a cathode electrode heated by bombardment of electrons emitted by a heater electrode so that selected parameters of such device may be determined without requiring that such device be operational, the method in particular including the steps of causing the cathode electrode to be brought to operating temperature within a short period of time and determining that the current due to electrons bombarding the cathode electrode is within predetermined limits.

12 Claims, 2 Drawing Sheets

METHOD TESTING ELECTRON DISCHARGE TUBES

BACKGROUND OF THE INVENTION

This invention pertains generally to a method of testing an electron discharge device, and particularly to a method for testing of an electron discharge device that uses an indirectly heated cathode electrode.

It is known in the art that the types of electron discharge devices known as traveling wave tubes (TWTs) may be used as power amplifiers in transmitters carried by guided missiles (referred to hereinafter simply as "missiles") that incorporate active guidance systems. Although the electrical parameters of any type of TWT for such an application may be conventional, there are stringent ancillary requirements that must be met by any satisfactory type of TWT used in missiles. In particular, a TWT for a missile must be: (a) adapted to be changed from a dormant (or "OFF") condition to an operative (or "ON") condition in a relatively short period of time (say, one second); and (b) adapted to maintain a vacuum at a designed level for a long period of time in a dormant condition (say, a pressure no greater than $1 \times 10^{-6}$ torr for a period of ten years).

Unfortunately, it is not feasible to manufacture TWTs that may be guaranteed to maintain a desired degree of vacuum for years. It is more economical to manufacture TWTs following state of the art practices and replace any TWT that becomes "soft"; i.e., loses the desired level of vacuum. It has been found, however, that field testing for the level of vacuum in a TWT requires that the TWT be turned "ON", a state that may not be tolerated in many tactical situations.

In addition to the foregoing, it is necessary on occasion to determine the state of the electron-emitting surface of a cathode in TWT that has been in storage or inoperative for a long period of time. According to the prior art, the state of an electron-emitting surface of the cathode would be determined by operating the TWT. A test specifically directed to determining the state of the electron-emitting surface without operating the TWT is not now known.

Still other tests of a TWT and ancillary circuits may be carried out to advantage before such a device is completely operative. For example, the high voltage supply for TWT may be tested before the cathode of such a tube is activated or tests may be carried out to detect arcing within such a tube before the "ON" condition is attained.

SUMMARY OF THE INVENTION

In view of the foregoing background of this invention, a primary object is to provide a method of field testing electron discharge devices such as a TWT, such method including the step of measuring the current between a heater electrode (referred to sometimes as a "heated filament") and a cathode electrode during warm-up, i.e., the period of time during which the cathode is changing from a dormant condition to an operative condition, to determine the degree of vacuum within the envelope of the electron discharge device under test.

Another object of this invention is to provide a method of determining the state of the electron-emitting surface on the cathode electrode of an electron discharge device such as a TWT.

Still another object of this invention is to provide a method for field testing various parameters of an electron discharge device such as a TWT without requiring that the TWT be "ON".

The foregoing and other objects of this invention are generally attained by providing, in a transmitter wherein a TWT having an indirectly heated cathode is used as a power amplifier, built-in test equipment adapted primarily to determine the quality of the vacuum within the envelope of the TWT without requiring that the TWT be rendered operational. To accomplish the foregoing, the cathode electrode is rapidly heated by bombardment by a stream of electrons from the heater electrode and, at the same time, a corresponding current, indicative of the gaseous pressure within the envelope of the TWT, is determined. The invention also encompasses the concept of energizing, at different times during a testing sequence, other electrodes within the TWT to determine either the condition of such energized electrodes or of ancillary circuits.

BRIEF DESCRIPTION OF THE DRAWINGS

For a more complete understanding of this invention reference is now made to the following description of the accompanying drawings, wherein.

DESCRIPTION OF THE PREFERRED EMBODIMENT

Figure 1:
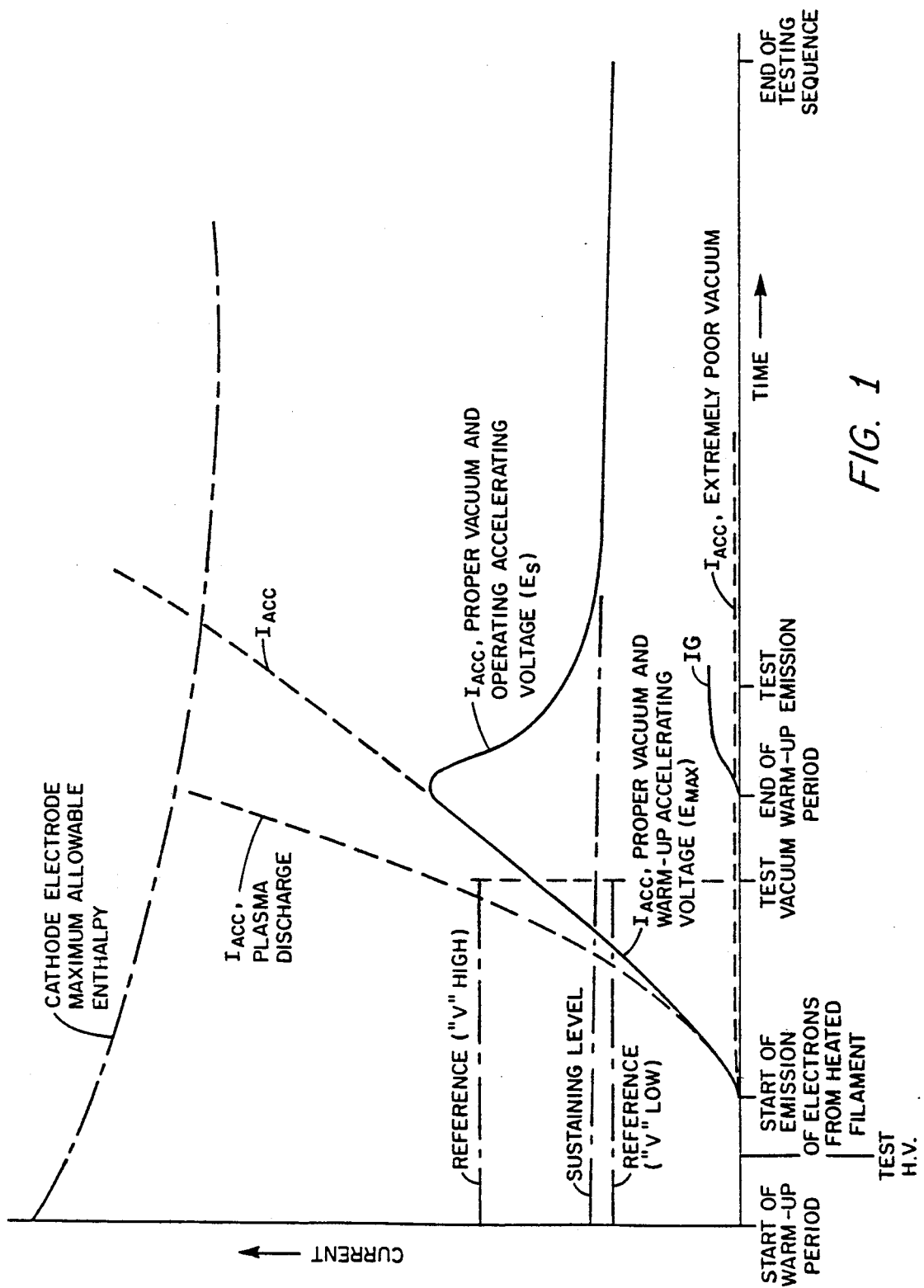
FIG. 1 is a sketch illustrating how the flow of electrons between a heater electrode and cathode electrode in a bombardier type of TWT may vary during warm-up and operation of a tube of such type, the sketch further showing when various tests here contemplated by this invention may be carried out.

It will be observed before discussion of FIG. 1 that the curves shown in that FIGURE are qualitative in nature to illustrate conditions that may exist during warm-up of a TWT, such as a type QKW 2087 manufactured by Raytheon Company, Microwave and Power Tube Division, Foundry Avenue, Waltham, Mass. 02254. It will also be observed that in such a TWT (wherein heating of a cathode electrode is accomplished through bombardment by electrons originating at a heated filament spaced from the cathode electrode), the enthalpy of the cathode electrode is a function of the velocity of the electrons impinging on the cathode electrode and of the density of the stream of electrons passing between the heated filament and cathode electrode. Still further, it will be observed that acceleration of electrons is caused by an accelerating force resulting from an accelerating voltage impressed across the heated filament and cathode electrode. The magnitude of the accelerating force (and the concomitant kinetic energy of the electrons impinging on the cathode electrode) is, of course, dependent upon difference between the potentials on the heated filament and cathode electrode. It follows, then, that the time required for heating of the cathode electrode to the proper temperature (typically 1300 degrees Kelvin) to induce emission of electrons may be shortened (except when there is an extremely poor vacuum within the TWT) by applying a higher than normal accelerating voltage across the heated filament and the cathode electrode. Care must be taken, however, not to apply such higher than normal voltage for a period of time such that the maximum allowable enthalpy of the cathode electrode is exceeded.

With the foregoing in mind it may be seen in FIG. 1 that, immediately after start of a warm-up period, there is a short interval, say in the order of 0.2 seconds, during which, as the "heated" filament is being warmed, no electrons are emitted from such filament. Therefore, the electron flow (designated "$I_{ACC}$") is, for all practical purposes, then equal to zero. Any desired test requiring the actuation of a high voltage supply may then be carried out without any possibility of producing energy at the output of the TWT. After the start of emission of electrons from the heated filament starts, one of three different conditions may exist. Firstly, if there is a greater than normal accelerating voltage applied across the heated filament and cathode electrode (meaning that a warm-up accelerating voltage in the order of 270 volts is so applied) and if a pro-per vacuum (meaning that the gaseous pressure within the TWT is less than, say, $1 \times 10^{-6}$ torr, then the electron flow, $I_{ACC}$, increases as shown by the solid line labeled "$I_{ACC}$, PROPER VACUUM AND WARM-UP ACCELERATING VOLTAGE." If the vacuum within the TWT under test is good, the warm-up accelerating voltage is reduced to an operating accelerating voltage $E_S$, where $E_S$ is approximately 100 volts at the end of the warm-up period The end of the warm-up period here occurs at about 0.7 seconds after the start of testing As a result, the current flow between the heated filament and cathode electrode is rapidly reduced to a level designated "SUSTAINING LEVEL." That is to say, $I_{ACC}$ is reduced to a level such that energy causing heating of the cathode electrode is equal to radiation losses of such electrode. It is noted here in passing that if the warm-up accelerating voltage of 270 volts is maintained for a significant period of time longer than the warm-up period, the actual enthalpy of the cathode electrode will exceed the maximum allowable enthalpy of such electrode. The result then would be a catastrophic failure of the cathode electrode in what was a good TWT. Secondly, if the vacuum within the TWT softens, meaning that the gaseous pressure within the TWT is in the order of $1 \times 10^{-5}$ to $1 \times 10^{-3}$ torr because of leakage or failure of the getter in the TWT, the number of molecules of gas would be sufficient to sustain ionization during the warm-up period As a result, a plasma discharge would take place so that $I_{ACC}$ would (as shown by the curve in dashed line labeled "$I_{ACC}$, PLASMA DISCHARGE") reach a dangerous level before the end of the warm-up period. Thirdly, if the vacuum within the TWT has been spoiled, meaning that the gaseous pressure is greater than, say, $1 \times 10^{-3}$ torr, then no appreciable flow of electrons between the heated filament and the cathode electrode would take place even though a higher than normal accelerating voltage is extant. As a result, then (as shown by the curve in dashed line labeled "$I_{ACC}$, EXTREMELY POOR VACUUM"), $I_{ACC}$ remains substantially at zero during the warm-up period.

After the warm-up period (assuming that a TWT under test has a proper vacuum) the cathode electrode will have been heated to operating temperature. That is to say, a cloud of electrons from which an operational beam of electrons may be formed will have been emitted from the cathode electrode. If a modulation signal is applied to the control grid of the TWT (without applying normal high voltages to the beam forming electrodes and to the collector electrode of the TWT) a grid current (as indicated by the curve labeled "$I_G$") is caused to be drawn. However, if the emitting surface of the cathode electrode has been poisoned, the level of $I_G$ will remain at a very low level.

It will now be apparent that an appropriate test for determining the condition of the vacuum within a TWT using a "bombardier" cathode during warm-up may be devised. It will also be apparent that diverse other tests may be devised to test other parameters of a TWT and ancillary elements (such as power supplies).

Figure 2:
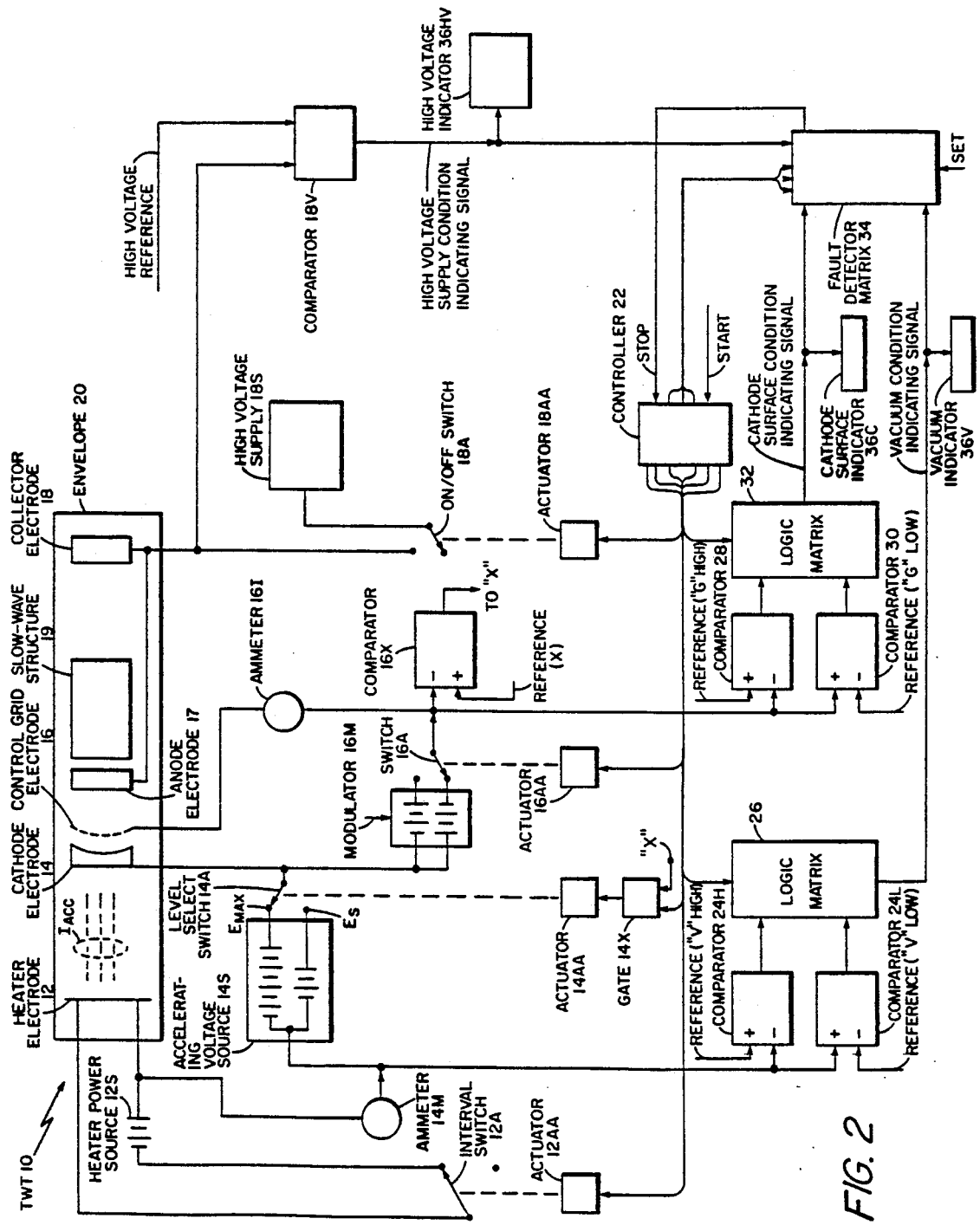
FIG. 2 is a combined block and schematic drawing illustrating how the method contemplated by this invention may be practiced.

Before referring to FIG. 2 in detail, it should be noted that, for clarity and ease of explanation, the anode, the collector electrode and the envelope of the illustrated TWT have been shown at some high positive potential relative to ground. As a result, one side of the heater electrode of the illustrated TWT is substantially at ground potential. It is felt that a person of ordinary skill in the art would realize that the anode, the collector electrode and envelope of a TWT could be grounded and the potential on the heater electrode could be at some high negative potential (relative to ground). It should also be noted that tests for electrodes other than the heater, cathode, control grid and collector electrodes and associated power supplies are illustrated, it also being felt that it would be elementary for a person of skill in the art to arrange for other tests of other elements, such as the slow-wave structure of a TWT.

Referring now to FIG. 2, a block diagram to carry out three different tests in accordance with the concepts of this invention are shown. A TWT 10 to be tested is shown to include a heater electrode 12, a cathode electrode 14, a control grid electrode 16 and a collector electrode 18, with each one of the just-mentioned electrodes supported in a known manner within an envelope 20 so that each such electrode may be connected to an appropriate energizing source. Thus, the heater electrode 12 is connected, through an interval switch 12A, to a heater power source 12S. Such source may conveniently be the heater power source of the TWT 10. An accelerating field is established between the cathode electrode 14 and the heater electrode 12 by connecting, via a level select switch 14A and an ammeter 14M, as shown, an accelerator source 14S. With switch 14A in the illustrated position a higher than normal accelerating voltage (or warm-up accelerating voltage), $E_{MAX}$, equaling 270 volts, is applied; with switch 14A in the second position an operating accelerating voltage, $E_S$ equaling 100 volts, is applied. The control grid electrode 16 is connected, via an ammeter 16I, to a modulator 16M. The second side of the latter in turn is tied to the cathode electrode 14 through a switch 16A when it is desired to test the condition of the emitting surface of the cathode electrode 14 or to operate the TWT 10. Finally, the collector electrode 18 is connected, via an OFF/ON switch 18A, to a high voltage supply 18S.

An actuator is associated with each one of the switches 12A, 14A, 16A, 18A so that opening and closing of such switch may be controlled by an appropriate signal to each actuator from a controller 22. Thus, actuator 12AA is associated with the interval switch 12A, actuator 14AA is associated with the level select switch 14A, actuator 16AA is associated with the switch 16A and actuator 18AA is associated with the ON/OFF switch 18A. It will be appreciated that the controller 22 may be constructed of known components to provide an actuating signal at appropriate times to each one of the actuators 12AA, 14AA, 16AA, 18AA. Thus, in response to a "start" testing signal to initiate operation of the controller 22, control signals are generated in the controller 22 for the actuator 12AA, the actuator 14AA via gate 14X and the actuator 18AA so as to position each one of the associated switches (interval switch 12A, level select switch 14A and ON/OFF switch 18A), as shown. Current from the heater power source 12S is thereby passed through the heater electrode 12 to initiate heating of that electrode; an accelerating field due to a greater than normal accelerating voltage, $E_{MAX}$, is impressed across the cathode electrode 14 and the heater electrode 12; and the high voltage supply 18S is connected to the collector electrode 18. As noted in connection with FIG. 1, some time will elapse before emission of electrons from the heater electrode 12. Until such emission begins, the TWT 10 produces no output, but the condition of the collector electrode 18 and the high voltage supply 18S will be indicated by a comparator 18V. Thus, with a HIGH VOLTAGE REFERENCE also applied to the comparator 18V, such comparator may be arranged to produce a HIGH VOLTAGE SUPPLY CONDITION INDICATING SIGNAL that is a positive (I.E., logic true) signal only when the high voltage supply 18S is operating properly and there are no short circuits to ground anywhere in the high voltage circuit. In any event, the control signal to the actuator 18AA is changed before the commencement of emission of electrons from the heater electrode 12.

Immediately after commencement of emission of electrons from the heater electrode 12, the attractive field caused by the higher than normal accelerating field due to $E_{MAX}$ causes essentially all of such electrons to move toward the cathode electrode 14 indicated by the dashed lines labeled $I_{ACC}$ in FIG. 2. The kinetic energy of such electrons is converted to heat energy in the cathode electrode 14, thereby raising the temperature of such electrode until a cloud of electrons is emitted from the emitting surface of the cathode electrode 14 (if the emitting surface has not been contaminated). At the same time, a circuit path for $I_{ACC}$ is completed (via the accelerator source 14S and an ammeter 14M) for current flowing between the heater electrode 12 and cathode electrode 14. The ammeter 14M (which may, for example, be a Hall effect cell, Model No. 903B-100 from American Aerospace Controls, Inc., Farmingdale, New York responsive to the magnetic field caused by $I_{ACC}$) produces an analogous signal for a pair of comparators 24H, 24L. Each one of such comparators may be a differential amplifier with a REFERENCE ("V" HIGH) signal and a REFERENCE ("V" LOW) signal applied as indicated along with the analogous signal. It may be seen in FIG. 1 that the outputs of the comparators 24H, 24L at some time during the warm-up period may be deemed to indicate the condition of the vacuum within the envelope 20. Thus, if the vacuum is "good" at the time designated TEST VACUUM in FIG. 1, $I_{ACC}$ would fall between the levels marked REFERENCE ("V" HIGH) and REFERENCE ("V" LOW). Both comparators 24H, 24L would then produce positive voltages, i.e., logic true signals, for application to a logic matrix 26. At the same time, an enabling signal from the controller 22 is applied to the logic matrix 26. The enabling signal determines the time at which the vacuum test is to be carried out. The logic matrix 26 may simply be a matrix of AND gates to produce a logic true signal only when the three inputs are all logic true signals. A logic true signal out of the logic matrix 26 then is indicative of a proper vacuum within the envelope 20. If, at time TEST VACUUM, the output of either comparator 24H, 24L is not a logic true, the vacuum within the envelope 20 is not correct. Thus, if the gaseous pressure supports a plasma discharge, the level of $I_{ACC}$ would be such that the output of the comparator 24H would be a logic untrue. If the vacuum were completely destroyed, the output of the comparator 24L would also be a logic untrue. Therefore, the output of the logic matrix 26, i.e., the level of the signal on the line designated "VACUUM CONDITION INDICATING SIGNAL" would be a logic true when the gaseous pressure is within acceptable limits and a logic untrue otherwise.

The control grid electrode 16 is connected, via an ammeter 16I and a switch 16A, to a modulator 16M. As indicated, the modulator 16M is made up of two voltage sources (not numbered) poled as shown. An actuator 16AA, responsive to an appropriate signal just after the end of the warm-up period (FIG. 1) causes the switch 16A to connect the positive voltage source and to disconnect the negative voltage source. Electrons in the cloud of electrons emitted from the cathode electrode 14 are then drawn to the control grid electrode 16, thereby engendering current through the ammeter 16I. That element which here is a pulse sensing toroid manufactured by Pearson, Inc., Palo Alto, California produces a signal indicative of control grid current. Such signal is impressed on a pair of comparators 28, 30. A reference signal, REFERENCE ("G" HIGH) is applied to the comparator 28 as shown and a reference signal, REFERENCE ("G" LOW) is applied to the comparator 30, as shown. It follows then that comparators 28, 30 simultaneously produce logic true signals when the control grid current is between predetermined values. That is to say, (a) if the control grid current is below the level determined by REFERENCE ("G" LOW), the output of the comparator 30 is a logic untrue signal; (b) if the control grid current is above the level determined by REFERENCE ("G" HIGH), the output of the comparator 28 is a logic untrue signal; and (c) if the control grid current is between the levels determined by both reference signals, then the outputs of both comparators 28, 30 are logic true signals. To put it another way, if the emitting surface of the cathode electrode is uncontaminated and the positive voltage in modulator 16M is not too low, the control grid current will be above the level determined by REFERENCE ("G" LOW), and if the positive voltage in modulator 16M is too high, the cathode grid current will be below a maximum level determined by REFERENCE ("G" HIGH).

The outputs of the comparators 28, 30 are fed to a logic matrix 32 along with a timing signal from the controller 22. The logic matrix 32 here is an AND gate matrix to produce, at a time determined by the timing signal, a signal designated "CATHODE SURFACE CONDITION INDICATING SIGNAL." As just noted, that signal is a logic true signal when the emitting surface of the cathode electrode 14 is uncontaminated and below a predetermined temperature.

The collector electrode 18 and the internally connected anode electrode 17 are connected, via an ON/OFF SWITCH 18A, to a high voltage supply 18S. The ON/OFF SWITCH 18A is controlled by a timing signal from the controller 22. As noted in the discussion of FIG. 1, that timing signal occurs during a test sequence before any electrons are emitted by the heater electrode 14. A comparator 18V is connected in any known manner (not shown) to produce a logic true signal when the voltage on the collector electrode 18 is above the level labeled "HIGH VOLTAGE REFERENCE" and a logic untrue signal when the voltage on the collector electrode 18 is below the level labeled "HIGH VOLTAGE REFERENCE." The level for the "HIGH VOLTAGE REFERENCE" is chosen so as not to indicate a voltage greater than the lowest acceptable level of the high voltage supply 18S. Consequently, the output of the comparator 18V, i.e., the "HIGH VOLTAGE SUPPLY CONDITION INDICATING SIGNAL," is a logic true signal when testing shows that: (a) a proper level of the output of the high voltage supply 18S exists; and (b) the collector electrode 18 (as well as all points in the high voltage circuit connected to such electrode) is adequately insulated from ground.

As each one of the just described tests is completed, the resulting condition indicating signal is applied to a fault detector matrix 34. That matrix is arranged in any convenient manner to produce a STOP signal for the controller 22 if any of the condition indicating signals is a logic untrue signal. Each one of the three condition indicating signals is also applied to an indicator (vacuum indicator 36V, cathode surface indicator 36C, high voltage indicator 36 HV).

It will be noted here in passing that the fault detector matrix 34 could include bistable multivibrators arranged to store (or latch) the result of each one of the described tests. If such an arrangement is used, the indicators may be connected to output terminals of such multivibrators.

It will be recognized that repetition of the test sequence just described may cause the cathode electrode 14 to be overheated to such an extent that the maximum allowable enthalpy of that electrode may be exceeded. That is to say, if the temperature of the cathode electrode 14 is elevated to any substantial degree above ambient temperature when $E_{MAX}$ is applied, and if $E_{MAX}$ is then applied for a period of time equal to the warm-up period, the enthalpy of the cathode electrode 14 will exceed the maximum allowable. The gate 14X and comparator 16X are provided to prevent the foregoing. Thus, the comparator 16X is arranged to produce a logic true signal whenever the current $I_g$ is slightly above a level that would be present in normal operation. To put it another way, the output of the comparator 16X changes from a logic true signal to a logic untrue signal when the designed operating temperature of the cathode electrode 14 is exceeded. Whenever such a situation obtains, the gate 14X is inhibited with the result that the actuator 14AA causes the switch 14A to be moved to connect $E_S$ between the cathode electrode 14 and the heater electrode 12. As noted previously, $E_S$ is a sustaining voltage that simply maintains the temperature of the cathode electrode 14 at a desired level.

It follows then that the length of time during which $E_{MAX}$ is applied is automatically restricted to the length of time required to raise the temperature of the cathode electrode 14 from the actual temperature at the moment a start signal is applied to the desired operating temperature. In other words, the length of the warm-up period is dependent upon the initial temperature of the cathode electrode when any test sequence is initiated.

Having described a preferred embodiment of this invention, it will now be appreciated that changes may be made without departing from the inventive concepts. Thus, parameters other than those described may be measured. For example, the slow wave structure 19 and ancillary power supplies could be tested. A test could be added to confirm that the high voltage has not exceeded a maximum value. High voltage testing could occur when the cathode electrode 14 is at the desired operating temperature, provided that the modulator 16M is not switched to positive voltage when the high voltage supply 18S is operating. Thus, many other tests could be performed while the tube is not "ON". It is felt, therefore, that this invention should not be restricted to its disclosed embodiment, but rather should be limited only by the spirit and scope of the appended claims.

What is claimed is:

1. A method of testing an electron discharge device comprising the steps of:
   (a) applying an accelerating field between a cathode electrode and a heater electrode in a properly evacuated envelope for a predetermined warm-up period;
   (b) measuring current flow between the heater electrode and the cathode electrode at a predetermined time interval after the predetermined warm-up period;
   (c) monitoring to ensure the current at the predetermined time interval is between a pair of predetermined values indicative of current in a poor vacuum and current in an extremely poor vacuum, respectively; and
   (d) producing a vacuum condition indicating signal indicative of the state of vacuum in the envelope.

2. The method as recited in claim 1 further comprising the steps of:
   (a) reducing the accelerating field between the cathode electrode and the heater electrode to a sustaining level;
   (b) applying a modulating signal to a control grid; and
   (c) measuring current at the control grid and comparing the current at the control grid with a first and second reference current indicative of the state of the cathode electrode.

3. The method as recited in claim 2 further comprising the step of:
   producing a cathode surface condition indicating signal indicative of the state of the emitting surface of the cathode electrode.

4. The method as recited in claim 2 further comprising the steps of:
   (a) applying a high voltage signal to a collector electrode at a predetermined time interval before the accelerating field induces emission of electrons from the heater electrode; and
   (b) comparing voltage at the collector electrode with a reference voltage representative of the lowest operating voltage of the collector electrode.

5. The method as recited in claim 4 further comprising the step of:
   producing a high voltage supply condition indicating signal indicative that there are no short circuits to ground for the high voltage signal.

6. The method as recited in claim 4 further comprising the steps of:
   (a) producing a vacuum condition indicating signal indicative of the state of vacuum in the envelope;
   (b) producing a cathode surface condition indicating signal indicative of the state of the emitting surface of the cathode electrode; and
   (c) producing a high voltage supply condition indicating signal indicative that there are no short circuits to ground for the high voltage signal.

7. The method as recited in claim 4 further comprising the steps of:
   (a) comparing the current in the control grid with a third reference current indicative of a maximum permissionable temperature of the cathode electrode; and
   (b) reducing the accelerating field between the cathode electrode and the heater electrode to the sustaining level when the maximum permissionable temperature is exceeded.

8. A method of testing an electron discharge device that incorporates, in a vacuum, a cathode electrode heated by bombardment by electrons from a heater electrode spaced from the cathode electrode, a control grid electrode disposed in the path of electrons emitted by the cathode electrode when such electrode is heated and at least a collector electrode for collecting electrons passing through the control grid electrode, each one of the named electrodes being energized by an associated power supply, such method comprising the steps of:
   (a) energizing the heater electrode to cause, after a first interval of time, electrons to be emitted from such electrode;
   (b) applying a voltage across the heater electrode and the cathode electrode to create an accelerating field for electrons in the space between such electrodes so that substantially all electrons emitted by the heater electrode impinge upon the cathode electrode whereby the temperature of the cathode electrode is normally raised, during a second interval of time, from an ambient temperature to an operating temperature;
   (c) performing, during the first interval of time, tests on the collector electrode;
   (d) performing, during the second interval of time, tests to determine the quality of the vacuum within the electron discharge device; and
   (e) performing, during a third interval of time following the second interval of time, tests to determine parameters of the cathode electrode.

9. The method as in claim 8 wherein step (c) comprises the steps of:
   (a) applying a biasing signal from the associated power supply to cut off the electron discharge device; and
   (b) comparing the resulting voltage on the collector electrode with a reference voltage representative of the lowest operating voltage on the collector electrode.

10. The method as in claim 8 wherein the step (d) comprises the steps of:
   (a) increasing the level of the voltage applied across the heater electrode and the cathode electrode to a level substantially greater than the level required to sustain the temperature of the cathode electrode at an operational level;
   (b) comparing the current engendered by the flow of electrons between the heater electrode and the cathode electrode with a high and a low reference current indicative, respectively, of the upper and lower permissible limits of the engendered current; and
   (c) decreasing, at the end of the second interval if the result of step (b) indicates that the current is within the permissible limits, the level of the voltage applied across the heater electrode and the cathode electrode to an operating level, otherwise removing the voltage across the heater electrode and the cathode electrode and de-energizing the heater electrode.

11. The method as in claim 10 with the additional steps of:
   (a) applying, during the third period of time, a modulating signal to the control grid electrode to attract substantially all electrons the emitted from the cathode electrode; and
   (b) comparing the control grid current engendered by the electrons attracted to the control grid electrode with a first and a second reference current indicative of respective limits of the control grid current, thereby to provide an indication of the state of the emitting surface of the cathode electrode.

12. The method as in claim 11 with the additional steps
   (a) comparing, during the second interval of time, any control grid current then extant with a third reference current indicative of a maximum permissible temperature of the cathode electrode at the beginning of the first interval of time; and
   (b) if the result of step (a) indicates that the maximum permissible temperature of the cathode electrode at the beginning of the first interval of time has been exceeded, immediately reducing the level of the voltage applied across the heater electrode and the cathode electrode to an operational level.

* * * * *